US010457345B2

(12) United States Patent
Herrmann et al.

(10) Patent No.: US 10,457,345 B2
(45) Date of Patent: Oct. 29, 2019

(54) METHOD FOR MANUFACTURING AN AUTOMOTIVE MIRROR

(71) Applicant: SMR Patents S.à.r.l., Luxembourg (LU)

(72) Inventors: Andreas Herrmann, Winnenden-Baach (DE); Johannes Woessner, Stuttgart (DE); Ludwig Neumann, Werder (DE); Heiko Boehland, Berlin (DE); Muthu Kumaran, Chennai (IN)

(73) Assignee: SMR Patents S.à.r.l., Luxembourg (LU)

( * ) Notice: Subject to any disclaimer, the term of this patent is extended or adjusted under 35 U.S.C. 154(b) by 102 days.

(21) Appl. No.: 15/533,118

(22) PCT Filed: Dec. 7, 2015

(86) PCT No.: PCT/IB2015/059419
§ 371 (c)(1),
(2) Date: Jun. 5, 2017

(87) PCT Pub. No.: WO2016/088115
PCT Pub. Date: Jun. 9, 2016

(65) Prior Publication Data
US 2017/0327167 A1    Nov. 16, 2017

(30) Foreign Application Priority Data

Dec. 5, 2014  (EP) ..................................... 14196582
Apr. 8, 2015  (EP) ..................................... 15162850

(51) Int. Cl.
*B62D 65/00*  (2006.01)
*B62D 65/16*  (2006.01)
(Continued)

(52) U.S. Cl.
CPC ............ *B62D 65/16* (2013.01); *B25J 9/1687* (2013.01); *B25J 15/0052* (2013.01);
(Continued)

(58) Field of Classification Search
CPC .... B25J 15/00; B25J 15/0052; B25J 15/0253; B25J 15/0057; B25J 15/0061;
(Continued)

(56) References Cited

U.S. PATENT DOCUMENTS 3,448,553 A * 6/1969 Mahler ..................... B60R 1/04
248/466
4,646,210 A * 2/1987 Skogler ................. B60R 1/1207
359/872
(Continued)

FOREIGN PATENT DOCUMENTS

DE   102007039384 A1   2/2009
EP        1304260 A1   4/2003
(Continued)

OTHER PUBLICATIONS

Search Report dated Jun. 2, 2015, issued for EP 14196582.
Search Report dated Sep. 25, 2015, issued for EP 15162850.

*Primary Examiner* — Peter Dungba Vo
*Assistant Examiner* — Kaying Kue
(74) *Attorney, Agent, or Firm* — Jones Day

(57) ABSTRACT

A method for manufacturing an automotive mirror, in particular a side mirror, includes forming a printed circuit board as flexible printed circuit board with n+1 branches, n∈N, providing n modules each including at least one electronic element housed within a plastic casting and connected to conducting paths on at least one of the surfaces of the plastic casting, and at least one standard gripping point, guiding structure, snap connection element and/or sealing member provided by the plastic casting, connecting up to n of said
(Continued)

branches to one module each and connecting one branch to cables or a cable harness to be connected to a power supply and/or a control unit outside the mirror, providing mirror parts free of electronic elements, and assembling the mirror parts and the modules.

21 Claims, 6 Drawing Sheets

(51) Int. Cl.
| | |
|---|---|
| B25J 15/00 | (2006.01) |
| B25J 15/02 | (2006.01) |
| B60R 1/00 | (2006.01) |
| B60R 16/02 | (2006.01) |
| B25J 9/16 | (2006.01) |
| B60Q 1/26 | (2006.01) |
| B60R 1/12 | (2006.01) |
| B62D 65/02 | (2006.01) |
| H05K 1/02 | (2006.01) |
| H05K 7/02 | (2006.01) |
| B60R 1/06 | (2006.01) |

(52) U.S. Cl.
CPC ........ *B25J 15/0253* (2013.01); *B60Q 1/2665* (2013.01); *B60R 1/00* (2013.01); *B60R 1/1207* (2013.01); *B60R 16/0207* (2013.01); *B62D 65/022* (2013.01); *H05K 1/028* (2013.01); *H05K 7/026* (2013.01); *B60R 1/06* (2013.01); *B60R 1/12* (2013.01); *H05K 2201/052* (2013.01)

(58) Field of Classification Search
CPC ........ B62D 65/16; B62D 65/022; B60R 1/12; B60R 1/1207; H05K 1/028; H05K 7/026; H05K 1/12; H05K 1/06; H05K 1/00; B29C 45/00
USPC ................ 29/831, 830, 846, 592.1
See application file for complete search history.

(56) References Cited

U.S. PATENT DOCUMENTS

| | | | | |
|---|---|---|---|---|
| 4,807,096 | A * | 2/1989 | Skogler | B60R 1/086 362/142 |
| 4,831,278 | A * | 5/1989 | Ueda | B60R 16/0207 174/71 R |
| 5,590,948 | A * | 1/1997 | Moreno | B60Q 3/258 362/135 |
| 5,598,627 | A * | 2/1997 | Saka | H01R 12/62 174/72 A |
| 5,669,698 | A * | 9/1997 | Veldman | B60R 1/1207 362/140 |
| 5,820,245 | A | 10/1998 | Desmond et al. | |
| 5,984,482 | A * | 11/1999 | Rumsey | B60R 1/04 248/474 |
| 6,227,689 | B1 * | 5/2001 | Miller | B60Q 1/2665 362/494 |
| 6,325,517 | B1 * | 12/2001 | Kuo | B60Q 1/2665 340/475 |
| 6,532,652 | B2 * | 3/2003 | Nagai | H01R 12/68 29/831 |
| 7,196,836 | B2 * | 3/2007 | Bauer | B60R 1/088 359/265 |
| 7,667,579 | B2 * | 2/2010 | DeLine | B60K 35/00 340/425.5 |
| 7,832,882 | B2 * | 11/2010 | Weller | B60R 1/12 359/879 |
| 7,973,263 | B2 * | 7/2011 | Oehmann | B60Q 1/2665 219/201 |
| 8,451,332 | B2 * | 5/2013 | Rawlings | B60R 1/04 348/148 |
| 8,851,690 | B2 * | 10/2014 | Uken | G02B 7/182 359/875 |
| 9,352,691 | B2 * | 5/2016 | Watson | G02B 7/182 |
| 2002/0171954 | A1 | 11/2002 | Bonardi et al. | |
| 2006/0050018 | A1 * | 3/2006 | Hutzel | B60K 35/00 345/60 |
| 2008/0259576 | A1 * | 10/2008 | Johnson | H05K 1/028 361/749 |
| 2012/0099335 | A1 | 4/2012 | Boehland et al. | |

FOREIGN PATENT DOCUMENTS

| | | |
|---|---|---|
| WO | WO 2000/070374 A1 | 11/2000 |
| WO | WO 2004/058540 A2 | 7/2004 |
| WO | WO 2012/056115 A2 | 5/2012 |

* cited by examiner

METHOD FOR MANUFACTURING AN AUTOMOTIVE MIRROR

CROSS-REFERENCE TO RELATED APPLICATIONS

This application is a national stage entry of International Patent Application No. PCT/IB2015/059419, filed Dec. 5, 2014, which claims the benefit of foreign priority to European Patent Application No. 14196582.2, filed Dec. 5, 2014, and European Patent Application No. 15162850.0, filed Apr. 8, 2015, each of which is incorporated herein by reference in its entirety for all purposes.

STATEMENT REGARDING FEDERALLY SPONSORED RESEARCH OR DEVELOPMENT

Not applicable.

REFERENCE TO A COMPACT DISK APPENDIX

Not applicable.

BACKGROUND

1. Field

The following description relates to a method for manufacturing an automotive mirror.

2. Description of Related Art

Typically, the assembling of automotive mirrors, like side mirrors, is mostly done manually by human beings within a manufacturing unit. This leads to high costs and is time consuming. Therefore there is the need for providing automotive mirror parts suited for an automated robotic assembly line.

A gripping device for articles like motor vehicle headlights is known e.g. from DE 10 2005 062 706 A1. The known device has gripping units which exert gripping forces perpendicular to individual points of surfaces of such articles. Each gripping unit grips an article at one gripping point such that the article can be hold by the device. This allows for gripping of geometrically different articles of similar upper surface topology with the same device; but the gripping device is rather complicated and not suited for different surface topologies.

As mirror parts of an automotive side mirror like a housing part, a lighting module or a circuit board can have a large variety of geometries and/or topologies, even differing from model to model, presently most of the mirror parts are gripped in different manners with specific gripper designs. This requires time consuming and cost intensive gripper changes.

In order to provide a high degree of freedom, flexible circuit boards are used in automotive mirrors, see for example DE 10 2004 025 385. Such flexible circuit boards or wire harnesses provide terminals to be connected to different kinds of modules, like a blind spotter module, a ground light module and a turn signal module. The respective connection between the terminals and the modules and the subsequent attachment of the modules might even require assembling steps with gripper movements in different directions.

Molded Interconnect Devices (MID), which are plastic components containing electric printed circuit boards and functioning as 3 dimensional printed circuit boards, are in particular used in the automotive industry. Via Laser Direct Structuring (LDS) such electric printed circuit boards can for example be applied to plastic castings.

SUMMARY

It is the object of the present invention to provide an improved method for manufacturing an automotive mirror.

In an aspect, a method for manufacturing an automotive mirror, in particular a side mirror, includes: forming a printed circuit board as flexible printed circuit board with n+1 branches, n∈N, providing n modules each including at least one electronic element housed within a plastic casting and connected to conducting paths on at least one of the surfaces of the plastic casting, and at least one standard gripping point, guiding structure, snap connection element and/or sealing member provided by the plastic casting, connecting up to n of said branches to one module each and connecting one branch to cables or a cable harness to be connected to a power supply and/or a control unit outside the mirror, providing mirror parts free of electronic elements, and assembling the mirror parts and the modules.

It is preferred that the printed circuit board and the modules are connected to form a pre-assembled unit, and/or either the mirror parts and the modules or the pre-assembled unit are assembled by snap connections together with the mirror parts.

It is also proposed that each module is formed as a molded interconnect device (MID) providing the plastic casting with the conducting paths, with the MID preferably being a metalized two component injection molding, an injection molding with an impressed metal foil or a laser structured injection molding.

The plastic casting of each module may also be molded with the standard gripping point, in particular provided in an edge region, the guiding structure, in particular provided by a tapering, the snap connection element, in particular provided by a hook or recess, and/or the sealing member, in particular provided by a deformable projection.

Further, it is proposed that at last one of the modules is connected to a mirror part provided with a structure mating the guiding structure, the snap connection element and/or the sealing member of the module, respectively.

At least one of the modules may also include a lightning unit, preferably to function as a turn signal module, a blind spot warning module, a logo lamp unit, an environment illuminating unit or the like, or a motor, in particular for a mirror glass adjustment, or a sensor, in particular in form of a camera or radar sensor.

The method may also include providing at least some of the mirror parts and/or the flexible printed circuit board with at least one standard gripping point.

The method may also include providing a gripping device with at least one gripping unit designed for gripping the mirror parts, the modules and/or the flexible printed circuit board at the standard gripping points, and assembling the parts by controlling the gripping device.

It is further proposed that the standard gripping points may be provided by slots, cut outs, recesses, clips, straps, edges and/or projections, and/or the standard gripping points are introduced within the mirror parts, the modules and/or the flexible printed circuit board during manufacture thereof, and/or the standard gripping points are formed with a shape and/or dimension depending from the gripping unit design.

In addition, it is proposed that a gripping unit design may define the standard gripping points, and the mirror parts, the modules and/or the flexible printed circuit board are formed with the defined standard gripping points.

At least one structural feature of at least one of the modules, the flexible printed circuit board and/or the mirror parts fulfilling a separate function may be selected to provide at least one standard gripping point, and the gripping unit design and/or control is defined by the structural feature.

The separate function may be defined by a snap connection element for a mechanical connection or a terminal for an electrical connection.

The gripping device may be introduced into a production line, and/or the gripping device is integrated into an industrial robot as an end effector tool or is connected to an industrial robot via an automatic tool changer system.

The gripping device may be formed with a plurality of gripping units which are moved in different directions during the assembling, and/or the gripping device is operated by controlling motors, pneumatic systems and/or hydraulic systems, preferably in reaction to sensor output signals.

The gripping units may be moveable relative to each other and/or all together, each gripping unit may include a pair of 2 fingers for gripping one mirror part, one module or the flexible printed circuit board and an arm for moving said pair of 2 fingers.

It is also proposed that the fingers of each pair are moveable and/or cooperate with an ejection means for ejecting the part, the module or the flexible printed circuit board gripped by the respective pair of fingers.

In addition, the gripping units may be attached to a center spine, and the spine may be controlled to conduct a rotary and/or translatory movement via a center spine placing means.

Each gripping arm may include an upper arm and a lower arm, with the upper arm being moveable relative to the lower arm, and/or the upper arm being pivotable or rotatable relative to the lower arm with at least one axis of rotation via arm bending means.

Each pair of fingers may be designed to grip a branch of a flexible circuit board.

A control unit may cooperate with the gripping device, the tool connecting means, the center spine placing means, the arm bending means and/or the ejecting means, during an assembly the automotive mirror.

The control unit may receive signals from at least one sensor provided by the gripping device and/or at least one stopper.

The gripping device may electrically connect the flexible printed circuit board with the modules, preferably by crimping.

According to a first aspect of the invention the same is based on a modification of individual mirror parts, modules and/or printed circuit boards in order to make them suitable for handling during an automated assembling of an automotive mirror within a manufacturing unit, namely such that any type of common basic gripper instead of several different grippers for handling mirror parts, modules and/or printed circuit board with different designs and thus different geometries and/or topologies can be used. The modification is to provide standard gripping points. Such standard gripping points can be provided by slots, cut outs, recesses, clips, straps and/or projections and can be introduced at any available area e.g. within the individual mirror parts with a shape (like square, rectangular, triangular, circular, hexagonal, octagonal or pentagonal) and dimension adapted to the gripper design or vice versa. As soon as a common gripper design has been selected, pre-defined gripping points can be introduced on e.g. the mirror parts such that they can be assembled by a robot or automated. This reduces the overall costs involved in setting up a production line. In long term it also helps reducing the overall maintenance costs of the production line and also reduces the overall production cycle time and assembling time involved. Using standard gripping points on individual automotive mirror part, modules and/or printed circuit boards also enables a handling of these parts in any orientation or method by a robotic gripping device.

The slots, cut outs, recesses, clips, straps and/or projections providing the standard gripping points can fulfill an additional function like enabling a snap connection or can be provided by a functional member like a snap-in clips or even two terminals serving an electrical connection between a circuit board and an electric module like a lightning module.

According to a second aspect of the invention, during an automated assembling of an automotive mirror within a manufacturing unit a robotic gripping device is used which is in particular suited for handling mirror parts during the assembly of an automotive mirror, even in form of a flexible circuit board with e.g. n branches for connecting n electric modules to a power source, n being a member of the natural numbers above 1. Such a gripping device is provided with n gripping units each having one arm arranged around a central spine, each arm having a pair of 2 fingers, with the spine, the arms as well as the fingers being operated pneumatically, hydraulically and/or electrically for handling e.g. the n branches of a flexible circuit board, wire harnesses, mirror parts or any other applicable objects. Thus the gripping device can be operated by supplying for example air, oil, water or electrical current.

In case the spine has 2 degrees of freedom, namely for 1 translatory and 1 rotary movement, each arm is provided with 2 parts providing at least 1 further degree of freedom and each pair of fingers is provided with at least 1 additional degree of freedom, the gripping device is suited for ample assembly steps, even in different production directions. Thus, the gripping device is a multi operational gripper which can be used for different applications. By varying the features of the gripping units and by adjusting the position of the arms or fingers thereof, even more applications become possible.

The gripping device is designed based on the idea to benefit from a combination of the advantages of spider legs and a human palm with fingers and, therefore, is called spider gripper in the following.

The spider gripper can be directly integrated as an end effector tool to an industrial robot or to any type of machinery, but can also be used with an industrial robot or machinery via an automatic tool changer system where the tool side of the respective automatic tool changer module will be connected to the spider gripper top.

The preferred spider gripper has 6 arms and 6 pairs of fingers which are in particular designed for each holding a branch of a flexible circuit board. Each free end of an arm of the spider gripper has a small pneumatic or hydraulic cylinder or electrically operated motor based system for gripping one branch, inserting the terminals or connectors of said branch in corresponding sockets provided by an electric module and ejecting the branch at the end.

The number of arms and/or fingers of the spider gripper can be increased or decreased based on the design of the article to be handled, like the design of wire harnesses, and depending on the number of branches of involved flexible circuit boards. The position of the arms and fingers of the spider gripper relative to the central spine and/or relative to each other can be manually or pneumatically, hydraulically and/or electrically adjusted based on the handled articles.

The spider gripper spine, arms and fingers can be controlled individually. Sensors and mechanical stoppers can be used in the spider gripper for controlling the movement in particular of the individual arms and/or fingers.

BRIEF DESCRIPTION OF THE DRAWINGS

The invention, together with further objects and advantages, may be best understood, by example, with reference to the following description of embodiments taken together with the accompanying schematic drawings.

DETAILED DESCRIPTION

An automotive side mirror includes a plurality of parts, like a flexible printed circuit board (FPC) shown in FIGS. 1A and 1B and to be installed within a housing to connect electrical modules, e.g. a turn signal module, with a power supply and a control unit outside the automotive side mirror during assembly thereof, with said assembly being described with respect to FIGS. 2A and 2B below.

Figure 1A:
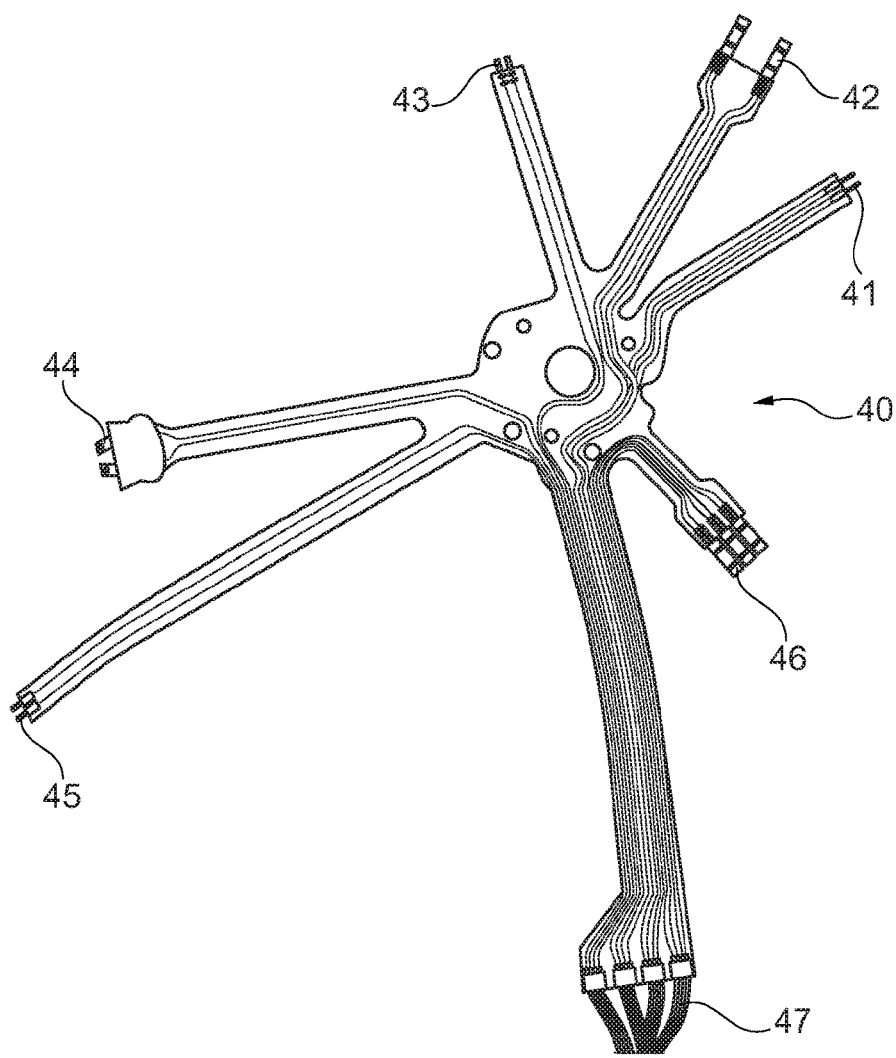
FIG. 1A shows a perspective view of a flexible circuit board without an electrical module of the invention being connected.
Figure 1B:
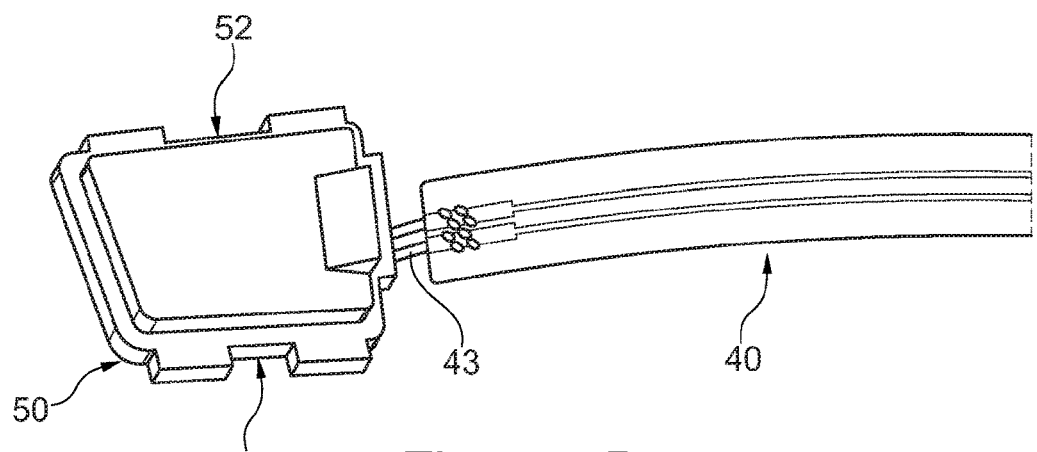
FIG. 1B shows an enlargement of one of the branches of the flexible circuit board of FIG. 1a with a connected electrical module.
Figure 2A:
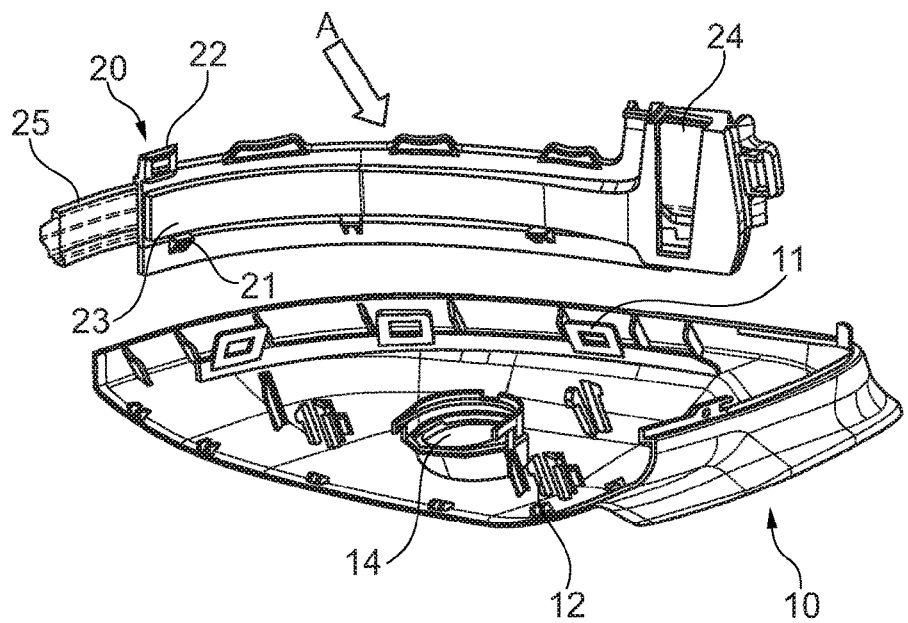
FIG. 2A shows a perspective view of a housing part and a second mirror part in form of a light guide unit prior to assembly.

The FPC 40 of FIG. 1A has 7 arms or branches, 6 of said branches being provided with terminals 41 to 46 to be connected to electrical modules, with FIG. 1B showing one of said 6 branches connected to one module 50, whereas the 7th branch is connected to cables 47 for connecting the electrical module 50 to a not shown power supply and a not shown control unit.

In a pre-assembly step the FPC 40 is connected with 6 modules 50 and the cables 47 by crimping, soldering or the like, to provide one unit. Said unit of the FPC 40, the 6 electrical modules 50 and the cables 47 looks like a spider (not shown) and, therefore, is called spider in the following.

In order to connect said pre-assembled spider to the remaining parts of the automotive side mirror in an automated production line with a spider gripper described with respect to FIGS. 6A and 6B below, each of said modules 50 is provided with standard gripping points. The electrical module 50 of FIG. 1B is formed with opposing recesses 52 providing said gripping points.

The gripping points providing recesses 52 of each of the 6 modules 50 allow for said spider gripper having 6 arms and, thus, 6 pairs of fingers to grip each of the modules 50 between 2 fingers of one arm for assembly. Each free end of an arm of the spider gripper has a small pneumatic or hydraulic cylinder or electrically operated motor based system for gripping one electric module 50 between 2 fingers engaging the module 50 within its recess 52 at two opposite sides, introducing the module 50 into a corresponding mirror part and ejecting the module 50 between said 2 fingers at the end of the assembly.

The modules 50 can be provided as MIDs with a plastic molding housing electrical components comprising e.g. a lightning unit to form in particular a turn signal module and providing conducting paths obtained by Laser Direct Structuring (LDS). The plastic molding can be provided with further structural features facilitating the assembly of the modules 50 of the spider to the remaining automotive mirror parts.

In case the module is to function as a turn signal module 500 connected to a flexible printed circuit board 400, it is to be assembled with a light guide unit 20 during the assembly thereof to a housing part 10 as will be explained with respect to FIGS. 2A and 2B in the following.

The light guide unit 20 is provided with a plurality of clip connection elements 21, 22 formed together with a housing 23 which is also provided with an opening 24 for inserting the turn signal module 500 between the housing 23 and a light guide 25.

The clip connection elements 21 are suited for engaging mating clip connection elements 11 provided by the housing part 10. The housing part 10 is formed in addition with further clip connection elements 12 for the connection of a mirror foot 30 extending through an opening 14 provided within the housing 10. The direction of assembly of the mirror parts 10, 20 and 30 is indicated by the arrow A in FIG. 2A.

The light guide unit 20 does not include any electronic element, in particular no lighting unit. All electronic elements required for providing a turn signal are arranged within the turn signal module 500 to be introduced into the opening 24 during assembly.

Figure 2B:
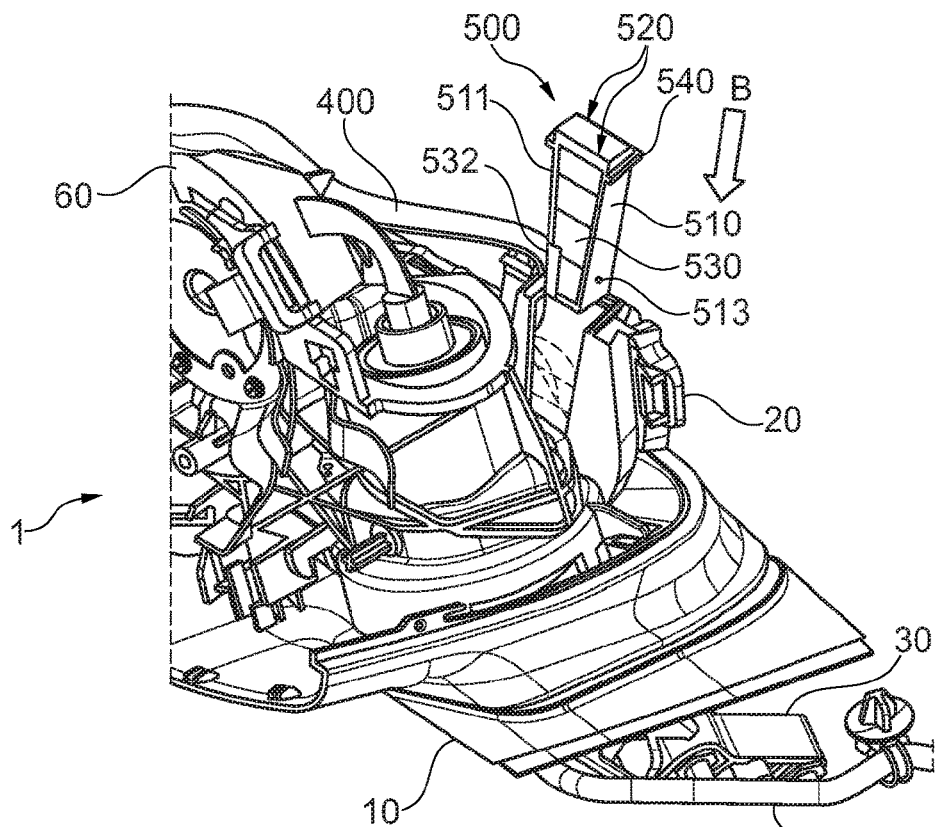
FIG. 2B shows an enlargement of the first mirror part in form of a housing part and the light guide unit of FIG. 2A after assembly and a turn signal module during assembly.

In an aspect, the two pre-assembled parts, namely a spider comprising the flexible printed circuit board 400, the turn signal module 500 and a cable harness 470, and a unit with the light guide 20, the housing part 10 and the mirror foot 30, are connected to each other via snap connections, with the assembly direction being indicated by the arrows B in FIG. 2B.

The turn signal module 500 is provided with opposing gripping edges 520 at its upper end facing away from the light guide unit 20 in FIG. 2B. Said gripping edges 520 can be gripped by said spider gripper, which can move the module 500 in assembly direction B to enter the opening 24.

The turn signal module 500 is provided with a opposing guiding faces 510, 511 providing a tapering facilitating the insertion of the turn signal module 500 into the opening 24. The turn signal module 500 is slided into the opening 24 by the spider gripper until an abutment of the guiding faces 510, 511 against corresponding surfaces of the housing 23, with a final locking by a snap connection. For that purpose the module 500 is provided with a snap connection element 513 in form of a hole into which a hook (not shown) provided within the light guide units 20 can enter.

In the assembled position of the turn signal module 500 within the light guide unit 20 a connection 532 of conducting paths 530 of the module 500 to the flexible printed circuit board 400 is arranged within the region of the opening 24. Still further, a sealing member 540 provided in form of a projection of the module 500 seals the connection between the light guide unit 20 and the exterior of the automotive mirror 1 to be assembled.

The spider gripper is detached from the module 500 as soon as the same has been placed into its final position within the opening 24.

Figure 3A:
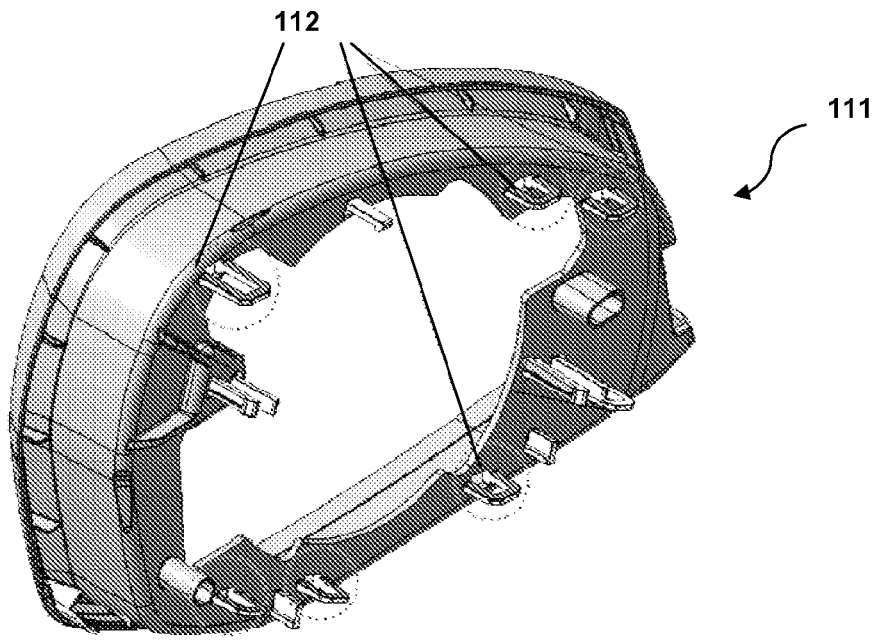
FIG. 3A shows a perspective view of a first mirror part in form of a housing ring with first gripping points provided by straps.
Figures 4A, 4B:
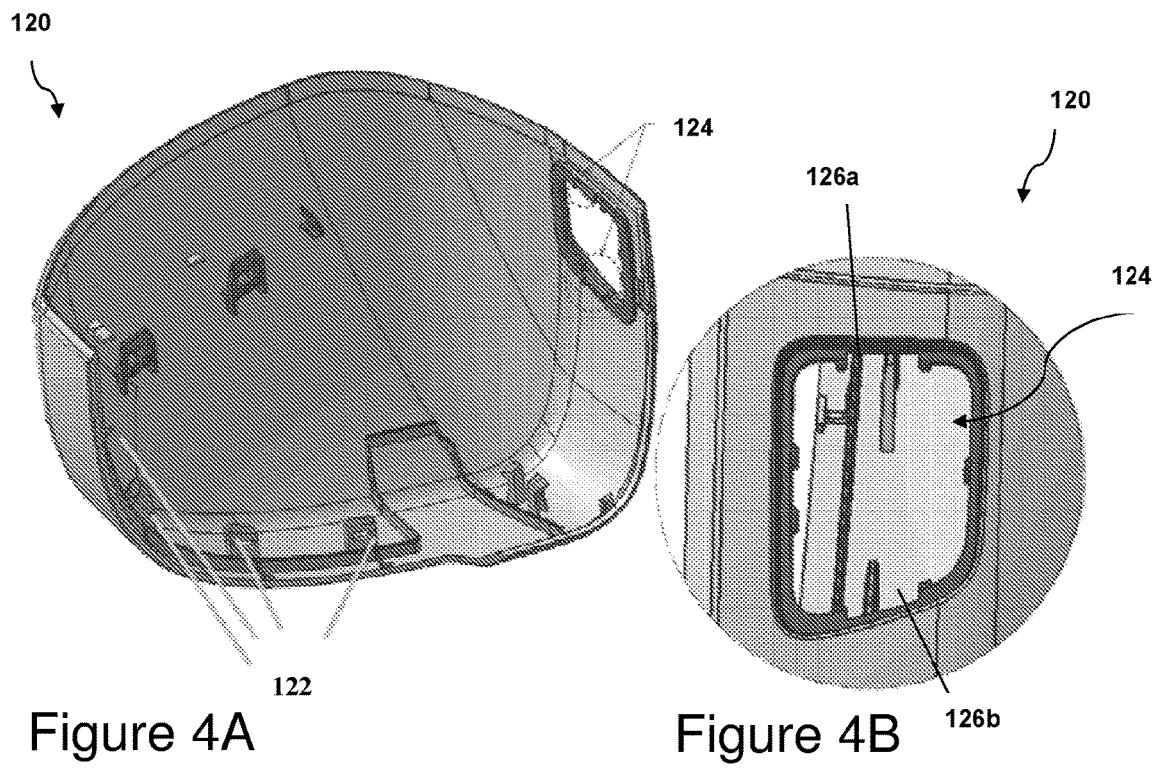
FIG. 4A shows a perspective view of a fourth mirror part in form of a top cap with fourth gripping points provided by clips.
FIG. 4B shows an enlargement of one of the clips of FIG. 4A with recesses.
Figure 5A:
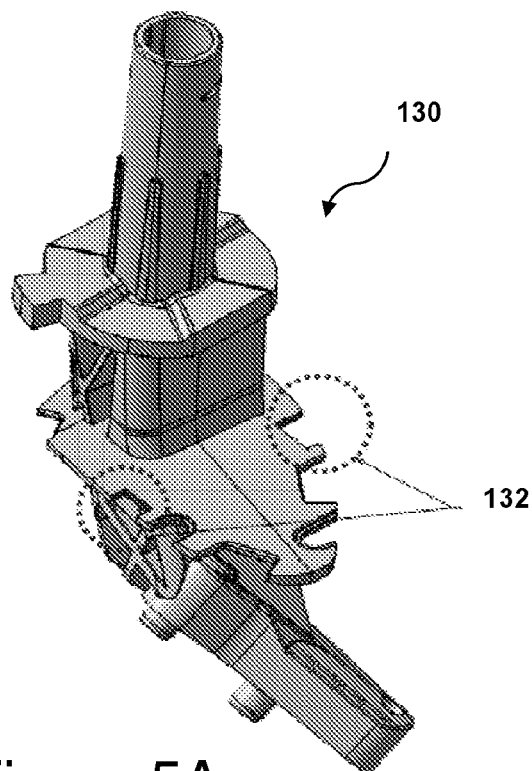
FIG. 5A shows a perspective view of a fifth mirror part in form of a mirror foot with fifth gripping points provided by cut outs.

Further mirror parts of an automotive side mirror will be described in the following, namely in form of a housing ring as shown in FIG. 3A, a top cap as shown in FIG. 4A and a mirror foot as shown in FIG. 5A. In order to assemble said mirror parts in an automated production line with a standard or rather common gripper each part is provided with standard gripping points.

Figure 3B:
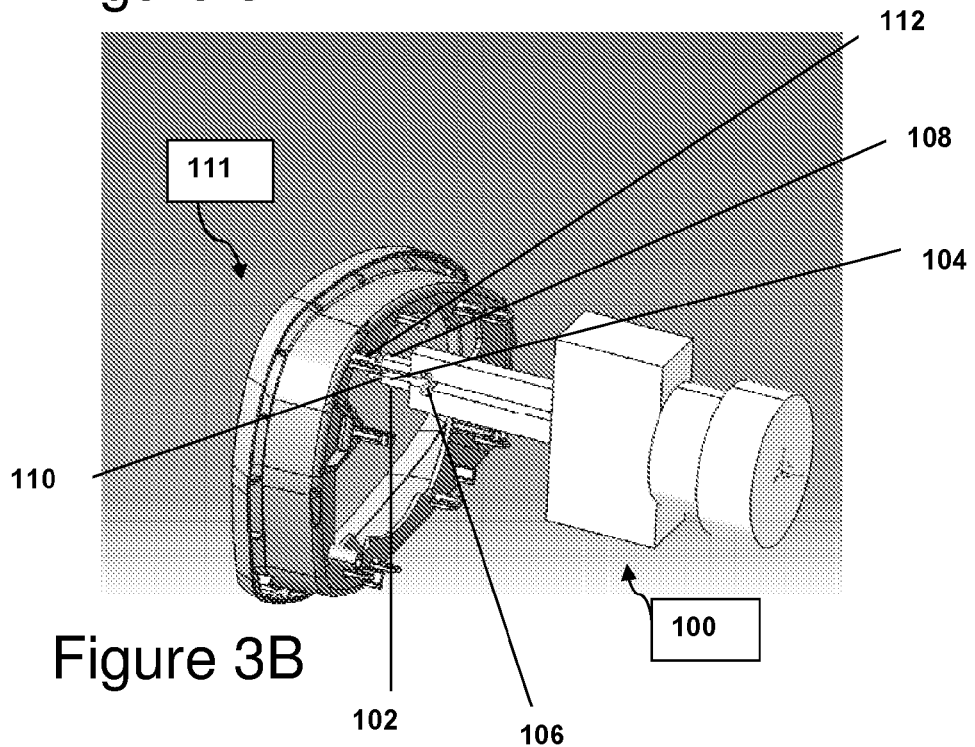
FIG. 3B shows the third mirror part of FIG. 3A gripped by a gripping unit at third gripping points.

The housing ring 111 shown in FIG. 3A includes a plurality of straps 112 each providing standard gripping points. This is further illustrated by FIG. 3B showing a standard gripping unit 100 with two gripping fingers 102 each having an inner surface 104 with a recess 106 and an outer surface 108 with a recess 110. Each strap 112 can be gripped between the inner surfaces 104 of the gripping fingers 102 of the gripping unit 100 in a standard manner.

Figure 4C:
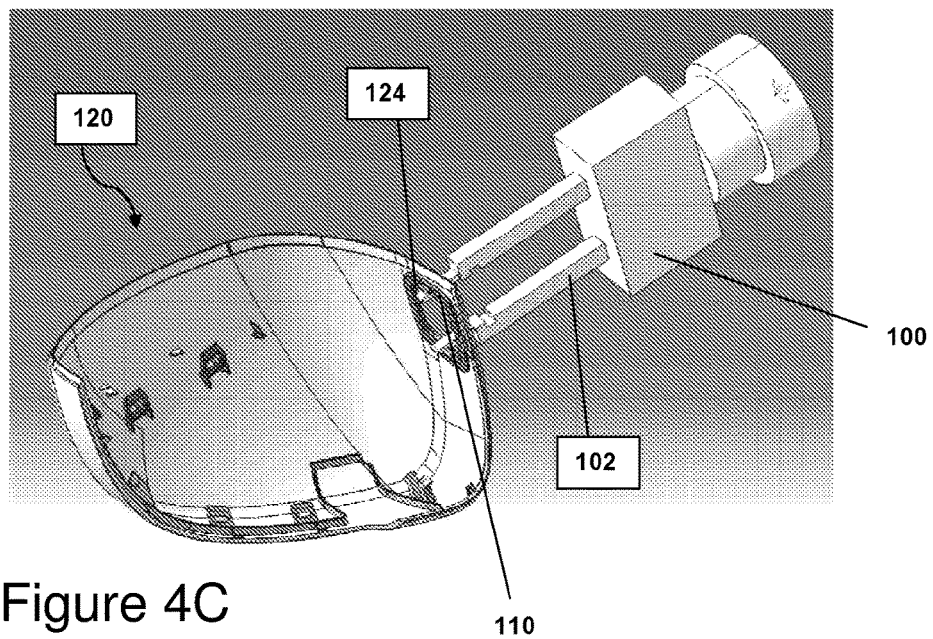
FIG. 4C shows the fourth mirror part of FIGS. 4A and 4B gripped by the gripping unit at fourth gripping points.

The top cap 120 of FIG. 4Aa includes two different kinds of standard gripping points in form of clips 122 and 124. The clips 122 correspond substantially to the straps 112 shown in FIG. 3A and can be gripped between the inner surfaces 104 of the gripping fingers 102 of the gripping unit 100, whereas the clip 124 is gripped by the outer surfaces 108 of the gripping fingers 102 of the gripping unit 100 by entering the gripping fingers 102 into recesses 126a, 126b as best seen in FIGS. 4B and 4C.

The clips 122 can also serve to enable a snap connection with another housing part of the automotive side mirror.

Figure 5B:
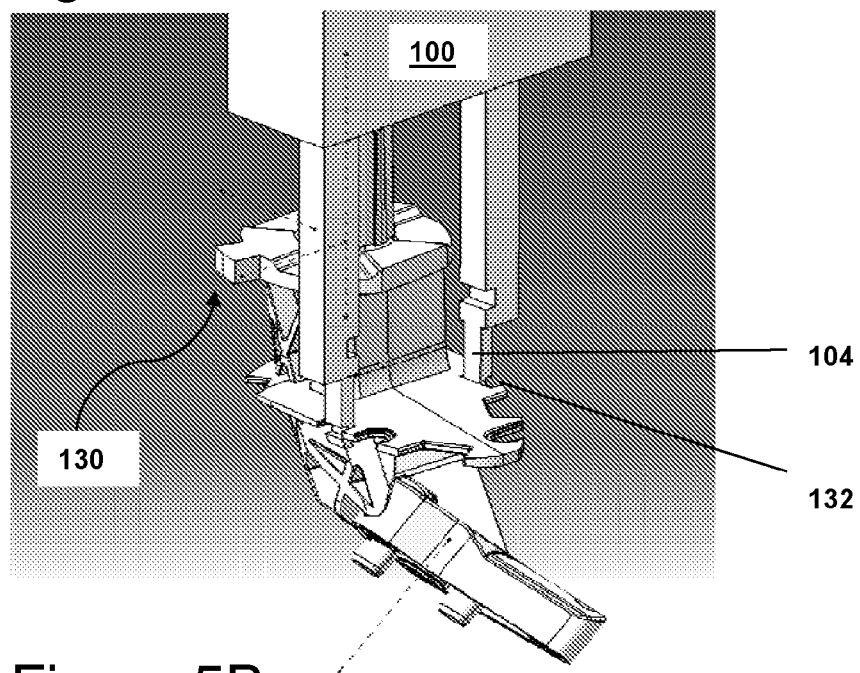
FIG. 5B shows the fifth mirror part of FIG. 5A gripped by the gripping unit at the fifth gripping points.

The mirror foot 130 of FIG. 5A is provided with two cut outs 132 forming standard gripping points with can be gripped between the inner surfaces 104 of the gripping fingers 102 of the gripping device 100 as shown in FIG. 5B.

Figure 6A:
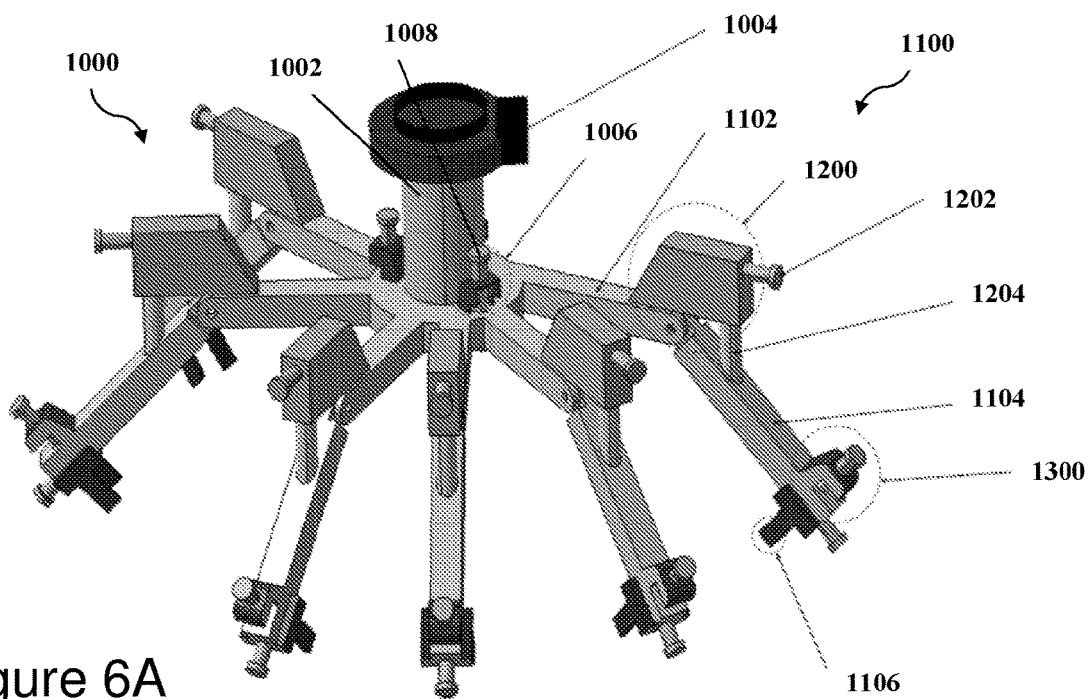
FIG. 6A shows a perspective view of an alternative gripping device.
Figure 6B:
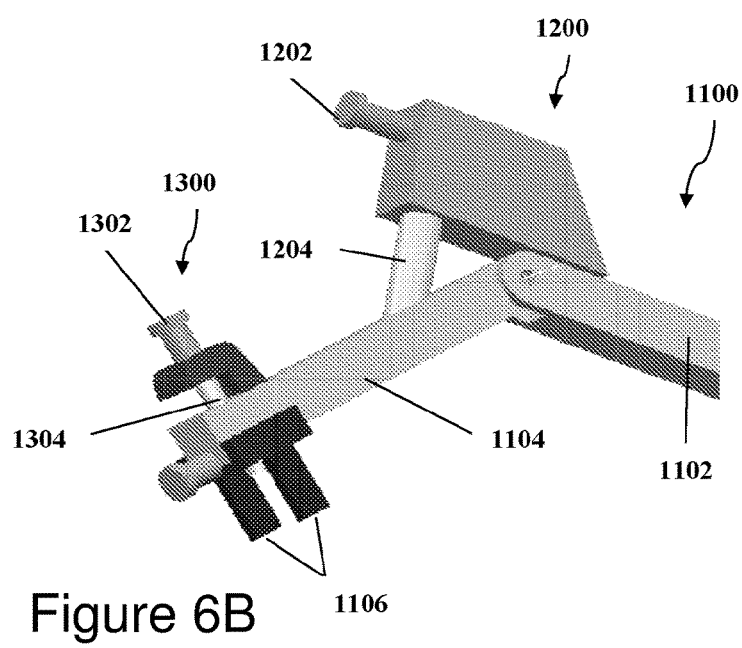
FIG. 6B shows an enlargement of one of the gripping units of the gripping device of FIG. 6A.

In order to handle a plurality of mirror parts, in particular in form of the spider provided by the flexible circuit board 40 having modules 50 attached to its plurality of branches as discussed with respect to FIGS. 1A and 1B; a gripping device 1000 may also be used as shown in FIG. 6A. Such a gripping device 1000 is provided with a center spine 1002 which is connected at its upper end in FIG. 6A to a tool connection means 1004 for the attachment to a not shown robot and at its lower end to six gripping units 1100. Via a center spine placing means 1006 operated by supplying air to air nipples 1008 the center spine 1002 can be moved upwards and downwards whereas a rotation of the center spine 1002 can be achieved manually.

Each gripping unit 1100 includes an arm having two parts, in form of an upper gripping arm 1102 and a lower gripping arm 1104, which can be pivoted with respect to each other via an arm bending means 1200 provided with an air nipple 1202 pneumatically moving a piston 1204. At the free end of the arm of each gripping unit 1100 a pair of gripping fingers 1106 is provided, as best seen in FIG. 6B. The fingers 1106 of each pair cooperate with ejecting means 1300 each provided with an air nipple 1302 in order to pneumatically move a piston 1304 to eject an article gripped between the two gripping fingers 1106.

The gripping device 1000 can be controlled to move its gripping units 1100 like the legs of a spider with the additional advantage of fingers of a human palm. With this particular design it is possible to grip each of the 6 branches of the flexible circuit board 40 shown in FIG. 1A between a pair of gripping fingers 1106 and move said branches in different directions relative to each other allowing a high degree of freedom with respect to the arrangement of the electrical modules 50 within the automotive side mirror 1 and still have them all connected to the power supply via the electrical circuit board 40.

Thus, the gripping device 1000 is not restricted to handling articles to be assembled in a single production direction, but provides a high degree of freedom enabling an optimal usage of flexible circuit boards. This also speeds up the manufacturing of automotive mirrors.

Although modifications and changes may be suggested by those skilled in the art, it is the intention of the application to embody within the patent warranted hereon all changes and modifications as reasonably and probably come within the scope of this contribution to the art. The features of the present invention which are believed to be novel are set forth in detail in the appended claims. The features disclosed in the description, the figures as well as the claims could be essential alone or in every combination for the realization of the invention in its different embodiments.

REFERENCE SIGN LISTING

1 automotive mirror
10 housing part
11, 12 clip connection element
14 opening
20 light guide unit
21, 22 clip connection element
23 housing
24 opening
25 light guide
30 mirror foot
40 flexible printed circuit board
41-46 terminals
47 cables
50 electrical module
52 recess
60 mirror plate adjustment unit
100 gripping unit
102 gripping finger
104 inner surface
106 recess
108 outer surface
110 recess
111 housing ring
112 strap
120 top cap
122 clip
124 clip
126a, 26b recess
130 mirror foot
132 cut out
400 flexible printed circuit board
470 cable harness
500 turn signal module
510, 511 guiding face
513 snap connection element 520 gripping edge
530 conducting paths
532 connection to flexible printed circuit board
540 sealing member
1000 gripping device
1002 center spine
1004 tool connection means
1006 center spine placing means
1008 air nipple
1100 gripping unit
1102 upper gripping arm
1104 lower gripping arm
1106 gripping finger
1200 arm bending means
1202 air nipple
1204 piston
1300 ejecting means
1302 air nipple
1304 piston
A, B assembly direction

The invention claimed is:

1. A method for manufacturing an automotive mirror, comprising the following steps: forming a printed circuit board as a flexible printed circuit board comprising n+1 branches, n c N; providing n modules each comprising at least one electronic element housed within a plastic casting and connected to conducting paths on at least one of the surfaces of the plastic casting; and at least one of a standard gripping point, guiding structure, snap connection element and sealing member provided by the plastic casting; connecting up to n of said branches to one module each and connecting one branch to cables or a cable harness to be connected to at least one of a power supply and a control unit outside the mirror; providing mirror parts free of electronic elements; assembling the mirror parts and the modules; providing a gripping device with at least one gripping unit; the at least one gripping unit gripping at least one of the mirror part, the modules and the flexible printed circuit board at the standard gripping point; and assembling the at least one of the mirror part, the modules and the flexible printed circuit board by controlling the gripping device.

2. The method according to claim 1, wherein the printed circuit board and the modules are connected to form at least one of a pre-assembled unit, and either the mirror parts and the modules or the pre-assembled unit are assembled by snap connections together with the mirror parts.

3. The method according to claim 1, wherein each module is formed as a molded interconnect device providing the plastic casting with the conducting paths, with the MID being a metalized two component injection molding, an injection molding with an impressed metal foil or a laser structured injection molding.

4. The method according to claim 1, wherein the plastic casting of each module is molded with at least one of the standard gripping point provided in an edge region, the guiding structure provided by a tapering, the snap connection element provided by a hook or recess, and the sealing member provided by a deformable projection.

5. The method according to claim 1, wherein at last one of the modules is connected to a mirror part provided with a structure mating at least one of the guiding structure, the snap connection element and the sealing member of the module, respectively.

6. The method according to claim 1, wherein at least one of the modules comprises
a lightning unit, to function as a turn signal module, a blind spot warning module, a logo lamp unit, an environment illuminating unit or the like;
a motor for mirror glass adjustment; or
a sensor in form of a camera or radar sensor.

7. The method according to claim 1, further comprising providing at least one of some of the mirror parts and the flexible printed circuit board with at least one standard gripping point.

8. The method according to claim 1, wherein the standard gripping point are provided by at least one of slots, cut outs, recesses, clips, straps, edges and projections; at least one of the standard gripping point are introduced within the mirror parts, the modules, and the flexible printed circuit board during manufacture thereof, and the standard gripping point are formed with at least one of a shape and dimension depending from the gripping unit design.

9. The method according to claim 1, wherein a gripping unit design defines the standard gripping point, and at least one of the mirror parts, the modules and the flexible printed circuit board mirror are formed with the defined standard gripping point.

10. The method according to claim 1, wherein at least one structural feature of at least one of the modules, the flexible printed circuit board and the mirror parts fulfilling a separate function is selected to provide at least one standard gripping point, and at least one of the gripping unit design and control is defined by the structural feature.

11. The method according to claim 10, wherein the separate function is defined by a snap connection element for a mechanical connection or a terminal for an electrical connection.

12. The method according to claim 1, wherein at least one of the gripping device is introduced into a production line, and the gripping device is integrated into an industrial robot as an end effector tool or is connected to an industrial robot via an automatic tool changer system.

13. The method according to claim 1, wherein at least one of the gripping device is formed with a plurality of gripping units which are moved in different directions during the assembling, and the gripping device is operated by at least one of controlling motors, pneumatic systems and hydraulic systems, in reaction to sensor output signals.

14. The method according to claim 1, wherein the gripping units are moveable relative to each other or all together, each gripping unit comprising
a pair of two fingers for gripping one mirror part, one module or the flexible printed circuit board; and
an arm for moving the pair of two fingers.

15. The method according to claim 14, wherein at least one of the pair of two fingers are moveable and the pair of two fingers are cooperate with an ejection means for ejecting the part, the module or the flexible printed circuit board gripped by the respective pair of fingers.

16. The method according to claim 14, wherein each gripping arm comprises an upper arm and a lower arm, with at least one of the upper arm being moveable relative to the lower arm, and the upper arm being pivotable or rotatable relative to the lower arm with at least one axis of rotation via arm bending means.

17. The method according to claim 14, wherein each pair of fingers is designed to grip a branch of a flexible circuit board.

18. The method according to claim 1, wherein the gripping units are attached to a center spine, and the spine can be controlled to conduct at least one of a rotary and translatory movement via a center spine placing means.

19. The method according to claim 1, wherein a control unit cooperates with at least one of the gripping device, the tool connecting means, the center spine placing means, the arm bending means and the ejecting means during an assembly of the automotive mirror.

20. The method according to claim 19, wherein the control unit receives signals from at least one sensor provided by at least one of the gripping device and at least one stopper.

21. The method according to claim 1, wherein the gripping device electrically connects the flexible printed circuit board with the modules by crimping.

* * * * *